(12) United States Patent
Berkcan et al.

(10) Patent No.: US 8,604,772 B2
(45) Date of Patent: *Dec. 10, 2013

(54) MEMS-BASED RESONANT TUNNELING DEVICES AND ARRAYS OF SUCH DEVICES FOR ELECTRIC FIELD SENSING

(75) Inventors: Ertugrul Berkcan, Niskayuna, NY (US); Naresh Kesa Van Rao, Niskayuna, NY (US); Aaron Knobloch, Niskayuna, NY (US)

(73) Assignee: General Electric Company, Niskayuna, NY (US)

(*) Notice: Subject to any disclaimer, the term of this patent is extended or adjusted under 35 U.S.C. 154(b) by 496 days.

This patent is subject to a terminal disclaimer.

(21) Appl. No.: 12/915,571

(22) Filed: Oct. 29, 2010

(65) Prior Publication Data

US 2011/0241702 A1 Oct. 6, 2011

Related U.S. Application Data

(63) Continuation-in-part of application No. 12/751,796, filed on Mar. 31, 2010, now Pat. No. 8,368,380.

(51) Int. Cl.
*G01R 19/00* (2006.01)

(52) U.S. Cl.
USPC ........ 324/76.11; 324/530; 324/246; 324/247; 324/636; 250/292; 250/370.1; 250/224; 257/E21.367; 257/E29.192; 257/E33.069; 257/E21.395

(58) Field of Classification Search
USPC .............. 324/76.11, 530, 246, 247, 636, 682, 324/76.51; 257/25, E29.192, 29.34, 257/E33.069, E21.367, E21.395; 250/292, 250/370.1, 224
See application file for complete search history.

(56) References Cited

U.S. PATENT DOCUMENTS 4,087,738 A * 5/1978 Van Degrift et al. .......... 324/322
4,224,683 A 9/1980 Adkins
(Continued)

FOREIGN PATENT DOCUMENTS

JP 1111347 A 4/1989
WO 02095712 A2 11/2002
(Continued)

OTHER PUBLICATIONS

Hartnagel, "Modulation of Quantum-Electronic Devices By Bending of Special MEMs Structures"; National Institute for Research and Development in Microtechnologies, 2004 IEEE; pp. 19-27.

(Continued)

*Primary Examiner* — Arleen M Vazquez
*Assistant Examiner* — Thang Le
(74) *Attorney, Agent, or Firm* — Scott J. Asmus

(57) ABSTRACT

A sensor assembly for electric field sensing is provided. The sensor assembly may include an array of Micro-Electro-Mechanical System (MEMS)-based resonant tunneling devices. A resonant tunneling device may be configured to generate a resonant tunneling signal in response to the electric field. The resonant tunneling device may include at least one electron state definer responsive to changes in at least one respective controllable characteristic of the electron state definer. The changes in the controllable characteristic are configured to affect the tunneling signal. An excitation device may be coupled to the resonant tunneling device to effect at least one of the changes in the controllable characteristic affecting the tunneling signal. A controller may be coupled to the resonant tunneling device and the excitation device to control the changes of the controllable characteristic in accordance with an automated control strategy configured to reduce an effect of noise on a measurement of the electric field.

25 Claims, 11 Drawing Sheets

(56) References Cited

U.S. PATENT DOCUMENTS

| | | | |
|---|---|---|---|
| 4,853,753 A * | 8/1989 | Capasso et al. | 257/25 |
| 5,387,887 A | 2/1995 | Zimmerman | |
| 5,389,804 A * | 2/1995 | Yokoyama et al. | 257/197 |
| 5,574,647 A | 11/1996 | Liden | |
| 5,782,973 A | 7/1998 | Weinberg | |
| 5,961,568 A | 10/1999 | Farahat | |
| 6,148,259 A | 11/2000 | Hagelauer | |
| 6,314,362 B1 | 11/2001 | Erzberger et al. | |
| 6,463,383 B1 | 10/2002 | Baiada et al. | |
| 6,604,044 B1 | 8/2003 | Kirk | |
| 6,606,553 B2 | 8/2003 | Zobell et al. | |
| 6,664,708 B2 | 12/2003 | Shlimak et al. | |
| 6,828,877 B2 | 12/2004 | Wakanishi | |
| 7,227,142 B2 | 6/2007 | Parker | |
| 7,248,963 B2 | 7/2007 | Baiada et al. | |
| 7,313,475 B2 | 12/2007 | Green | |
| 7,358,749 B2 * | 4/2008 | Kazama et al. | 324/754.27 |
| 7,378,837 B2 | 5/2008 | Andarawis et al. | |
| 7,601,320 B2 | 10/2009 | Van Dorp et al. | |
| 7,606,658 B2 | 10/2009 | Wise et al. | |
| 7,623,957 B2 | 11/2009 | Bui et al. | |
| 7,710,131 B1 * | 5/2010 | Tiernan | 324/754.29 |
| 7,924,107 B2 * | 4/2011 | Koyama et al. | 331/107 T |
| 8,060,295 B2 | 11/2011 | Estkowski et al. | |
| 8,165,736 B2 | 4/2012 | Gai et al. | |
| 8,255,147 B2 | 8/2012 | Roberts et al. | |
| 2002/0119591 A1 * | 8/2002 | Schulman | 438/91 |
| 2002/0175273 A1 | 11/2002 | Moddel et al. | |
| 2004/0031928 A1 | 2/2004 | Smith | |
| 2009/0003709 A1 | 1/2009 | Kaneda et al. | |
| 2009/0005960 A1 | 1/2009 | Roberts et al. | |
| 2009/0051452 A1 * | 2/2009 | Asada et al. | 331/107 T |
| 2009/0157288 A1 | 6/2009 | Bailey et al. | |
| 2010/0026400 A1 * | 2/2010 | Koyama et al. | 331/107 T |

FOREIGN PATENT DOCUMENTS

| | | |
|---|---|---|
| WO | 2009082785 A8 | 7/2009 |
| WO | WO2009081089 A | 7/2009 |

OTHER PUBLICATIONS

D. Dilella; L. J. Whitman; R. J. Colton; T. W. Kenny; W. J. Kaiser; E. C. Vote; J. A. Podosek and L. M. Miller; "A Micromachined Magnetic-Field Sensor Based on an Electron Tunneling Displacement Transducer"; © 2001-2010 Storming Media LLC. All rights reserved; 2 Pages; url:http://www.stormingmedia.us/22/2221/A222184.html.

Yeh C and Najafi K; "A low-voltage tunneling-based silicon microaccelerometer"; Electron Devices, IEEE Transactions on Publication Date: Nov. 1997vol. 44, Issue: 11; Current Version Published: Aug. 6, 2002; Sponsored by: IEEE Electron Devices Society; 3 Pages.

A. Audzijonis, R. Sereika , V. Lapeika and R. Altauskas; "Current mechanism in SbSeI crystals based on phonon-assisted tunnelling emission"; Aug. 10, 2006; Revised: May 3, 2007; Accepted: May 9, 2007; 4 Pages.

"Quantum Electron Tunneling Sensor"; Contact Information—Cheng-Hsien Liu (liuch@pme.nthu.edu.tw) and Tom Kenny (kenny@cdr.stanford.edu); 5 Pages; url: http://memsliu.pme.nthu.edu.tw/MSCL%20Projects/Quantum%20Electron%20Tunneling%20Sensor.htm.

"Quantum Electron Tunneling Sensor"; Contact Information—Cheng-Hsien Liu (liuch@pme.nthu.edu.tw) and Tom Kenny (kenny@cdr.stanford.edu); 6 Pages; http://memsliu.pme.nthu.edu.tw/MSCL%20Projects/Tunneling_Sensor.htm; retrieval date Mar. 4, 2010.

* cited by examiner

MEMS-BASED RESONANT TUNNELING DEVICES AND ARRAYS OF SUCH DEVICES FOR ELECTRIC FIELD SENSING

RELATED APPLICATIONS

The present application is a continuation-in-part of U.S. patent application Ser. No. 12/751,796, filed on Mar. 31, 2010, now U.S. Pat. No. 8,368,380 which is herein incorporated by reference in its entirety.

BACKGROUND

Embodiments of the invention relate to the field of electric field sensing, and more particularly to resonant tunneling based electric field sensors.

Stand-off sensing of an electric field may be required in certain applications. For example, non-invasive sensing may be required so that the electric field is not disturbed by the presence of an external body (sensing device). In one example application, the electric field to be sensed may be in a range from about 10 microvolt per meter to about 100 microvolts per meter at a stand-off distance of about 1 cm. Application specific frequency ranges may be in a range from about 0.5 Hz to about 30 Hz with bandwidth bins of about 5 Hz.

Conventional approaches to stand-off electric field sensing include optical approaches, capacitive approaches and approaches employing a superconducting quantum interference device (SQUID). SQUID requires cryo-cooling, hence, is not considered viable from a monetary and space point of view. Optical approaches for stand-off electric field sensing rely on electro-optic effects. Optical devices for such optical approaches can meet sensitivity requirements, however, these optical devices face challenges with regard to packaging requirements from a size, weight and cost perspective. Capacitive approaches provide a global optimum with respect to stand-off distance, however, disadvantageously, the capacitive devices, such as capacitive sensors suffer from low frequency electronic noise.

Accordingly, there is a need for electric field sensing devices that have reasonable sensitivity and are easy to package.

BRIEF DESCRIPTION

Aspects of the invention may be directed to a system for non-contactively measuring an electric field generated in an object. A sensor assembly includes a resonant tunneling device configured to generate a resonant tunneling signal in response to the electric field. The resonant tunneling device may comprise at least one electron state definer responsive to changes in at least one respective controllable characteristic of the electron state definer. The changes in the controllable characteristic may be configured to affect the tunneling signal. An excitation device may be coupled to the resonant tunneling device to effect at least one of the changes in the controllable characteristic affecting the tunneling signal. A controller may be coupled to the resonant tunneling device and the excitation device to control the changes of the controllable characteristic in accordance with an automated control strategy configured to reduce an effect of noise on a measurement of the electric field.

In one example embodiment, the sensor assembly may comprise an array of Micro-Electro-Mechanical System (MEMS)-based resonant tunneling devices. Each tunneling device may be configured to generate a respective resonant tunneling signal in response to the electric field and may comprise at least one electron state definer responsive to changes in at least one respective controllable characteristic of the electron state definer. The changes in the controllable characteristic may be configured to affect the tunneling signal. An excitation device may be configured to affect at least one of the changes in said at least one controllable characteristic affecting the tunneling signal. A controller may be configured to control the changes of the controllable characteristic. A signal conditioning device may be configured to provide signal conditioning to the tunneling signal. In one example variation, at least some of the array of resonant tunneling devices share in common at least one of the following devices: the excitation device, the controller, and the signal conditioning device. In one example application, the electric field may comprise at least one generally non-varying characteristic. The at least some of the array of resonant tunneling devices may be sharingly controlled, excited and/or conditioned by the corresponding shared device consistent with the generally non-varying characteristic of the electric field, which may be conducive to mapping a spatial distribution of the electric field.

In another example variation, each resonant tunneling device in at least some of the array of resonant tunneling devices may have at least one individually dedicated device from the following devices: the excitation device, the controller and the signal conditioning device. In one example application, the electric field and at least a further electric field may be generated in the object and may have at least one different characteristic. One or more of the array of resonant tunneling devices may be controlled, excited and/or conditioned by the corresponding dedicated device consistent with the different characteristic of the electric fields. This may be conducive to mapping a spatial distribution of the one electric field and the further electric field having the different characteristic.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
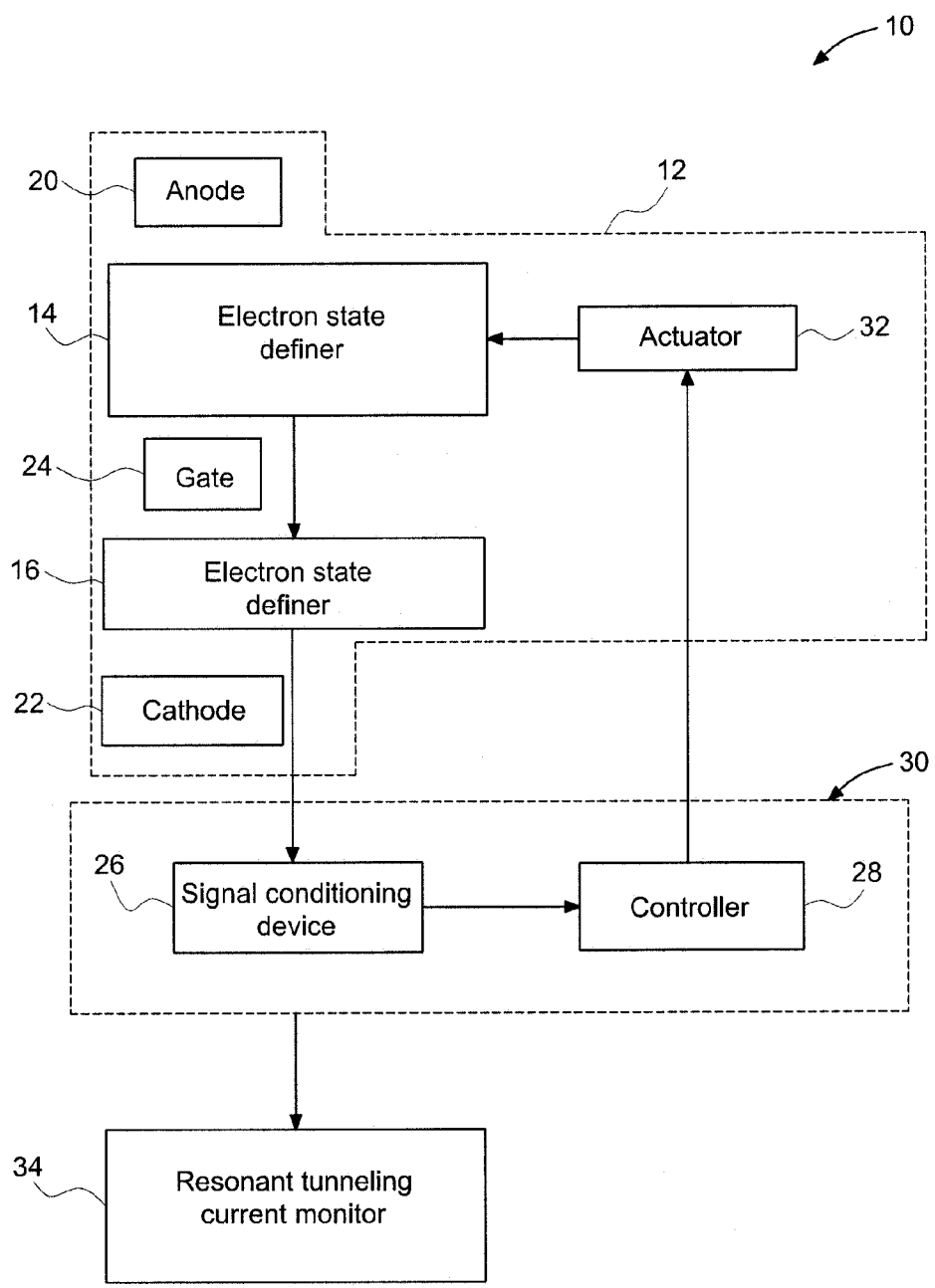
FIG. 1 is a schematic diagram representative of an example of a detection system employing a sensor assembly, in accordance with embodiments of the present technique.

In accordance with one or more embodiments of the present invention, a system for non-contact measurement of an electric field generated in an object will be described herein. In the following detailed description, numerous specific details are set forth in order to provide a thorough understanding of various embodiments of the present invention. However, those skilled in the art will understand that embodiments of the present invention may be practiced without these specific details, that the present invention is not limited to the depicted embodiments, and that the present invention may be practiced in a variety of alternative embodiments. In other instances, well known methods, procedures, and components have not been described in detail.

Furthermore, various operations may be described as multiple discrete steps performed in a manner that is helpful for understanding embodiments of the present invention. However, the order of description should not be construed as to imply that these operations need be performed in the order they are presented, nor that they are even order dependent. Moreover, repeated usage of the phrase "in one embodiment" does not necessarily refer to the same embodiment, although it may. Lastly, the terms "comprising", "including", "having", and the like, as used in the present application, are intended to be synonymous unless otherwise indicated.

In certain embodiments, a sensor assembly for sensing an electric field from a stand-off distance is provided. In certain embodiments, the sensor assembly functions on the principle of resonant tunneling. Resonant tunneling results in a substantial increase in the sensitivity of the detection of the electric field. In one embodiment, tunable resonant tunneling may be used for high-sensitivity, and high-resolution electric field sensing. Further, due to the stand-off sensing methods employed for sensing the electric field, the sensor assembly of the present invention has minimal or no negative impact on the magnitude of the electric field and/or direction of the current that is representative of the electric field being sensed. For example, sensing the current using the sensor assembly described herein does not introduce or cause any appreciable variation or change in the electric field being sensed. In certain embodiments, a stand-off sensor assembly comprises a plurality of electron state definers for generating resonant tunneling current in response to the electric field being sensed. The plurality of electron state definers comprises at least one variable characteristic such that the change in the variable characteristic affects the resonant tunneling current. Non-limiting examples of the variable characteristic include a bandgap thickness, a material thickness, or a gap distance. Further, the stand-off sensor assembly includes a monitor for monitoring a change in the tunneling current exiting the electron state definer based on a change induced in the variable characteristic of the electron state definers.

In certain embodiments, the size of the sensor assembly including the electron state definers may be a few centimeters. In some embodiments, the size of the electron state definers may be a few hundreds of microns (such as, from about 200 microns to about 600 microns) to a few millimeters (such as, from about 1 millimeter to about 3 millimeters), maintaining a small size of the sensor assembly facilitates sensing of the electric field in applications where space is limited. In addition, the structure of the electron state definers enables sensing of electric fields having strengths as low as 100 micro volts/meter.

To more clearly and concisely describe the subject matter of the claimed invention, the following definitions are provided for specific terms, which may be used in the following description and/or the appended claims.

As used herein, the term "stand-off detection" refers to a non-contact detection or detection without physical or electrical contact of the sensor with a body in which the electric field is being sensed or detection in which the sensor does not appreciably disturb the detection volume. In one example, stand-off detection may include a non-invasive detection.

A used herein, the term "stand-off distance" refers to a distance between the stand-off sensor assembly and the body in which the electric field is being sensed.

As used herein, the term "non-invasive detection" refers to a detection procedure that does not penetrate a body in which electric field is being sensed. For example, non-invasive detection may be performed by disposing a sensor on an outer case (such as skin) of a body (without any penetration of the outer case) in which the electric field is being sensed. In one example, a non-invasive detection may be a stand-off detection As used herein, the term "heterojunction" encompasses an interface that occurs between two layers or regions having dissimilar crystalline semiconductor materials.

As used herein, the term "tunable" refers to the ability of varying the shape and size of the energy barrier of the electron state definers. For example, a gap distance of a resonant tunneling device may be modulated to change a thickness of the energy barrier corresponding to an electron state definer of the resonant tunneling device to enable occurrence of resonant tunneling effect.

In quantum tunneling through a single barrier, the transmission coefficient is less than one (for incoming particle energy less than the potential barrier height). In a potential profile, which contains two barriers located close to each other that form a quantum well, the transmission coefficient is expressed as a function of the incoming particle energy. In general, a quantum well, is a potential structure, which spatially confines the electron. Resonance in the transmission coefficient of the incoming particle energy occurs at certain incident electron energies. The electron transmission coefficient through a structure is sharply peaked at these certain incident energies. For electrons with an energy corresponding approximately to the virtual resonant energy level of the quantum well, the transmission coefficient is close to unity. For these incident electron energies, the transmission coefficient is equal to one, i.e., the double barrier is transparent for particle transmission. That is, an electron with this resonant energy (for which the transmission coefficient is close to unity) can cross the double barrier without being reflected. This phenomenon is called resonant tunneling. That is to say, while the transmission coefficient of a potential barrier is always lower than one (and decreases with increasing barrier height and width), two barriers in a row can be completely transparent for certain energies of the incident particle. In certain embodiments, the two electron state definers are used to create the two energy barriers or the potential well. At particular values of the energy of the incident electrons, and energy of the energy barriers, the resonant tunneling current passes through the electron state definers. The value of this resonant tunneling current is used by the sensor assembly to calculate the electric field.

In certain embodiments, a mechanically modulated resonant tunneling approach is employed. Advantageously, quantum mechanical resonant tunneling provides high sensitivity, wide bandwidth electric field detection. The resonant tunneling results in a dramatic increase of the sensitivity to the electric field and effectively results in an amplification effect on the detection. In addition, mechanical modulation of the gap to move the signal out of band and away from noise sources such as the flicker (1/f) noise dramatically reduces the fundamental noise of the detector. The combined effect of the mechanically modulated resonant tunneling is to largely increase the signal while the noise is being reduced resulting in highly increased signal-to-noise ratio.

FIG. 1 illustrates one embodiment of system architecture for detection system 10 having a stand-off sensor assembly 12 for detection of an electric field. Sensor assembly 12 includes two electron state definers represented by reference numerals 14 and 16. The electron state definers 14 and 16 together form a resonant tunneling device. Each of the electron state definers 14 and 16 creates a corresponding energy barrier in the band structure. The electron state definers 14 and 16 create a dual energy barrier for approaching electrons, such that the electrons are generally not able to pass through one or both of the energy barriers. However, in the presence of an electric field, the energy barriers corresponding to the electron state definers 14 and 16 may be modified to permit transmission of electrons, thereby generating a resonant tunneling current. The resonant tunneling current thus produced is representative of the electric field that is being sensed.

Figure 2A:
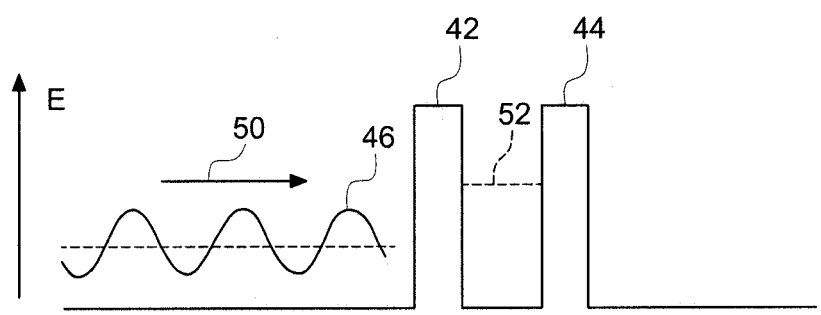
FIGS. 2A-2B are schematic representations of resonant tunneling principle showing an effect of the electric field on the energy bands.
Figure 2B:
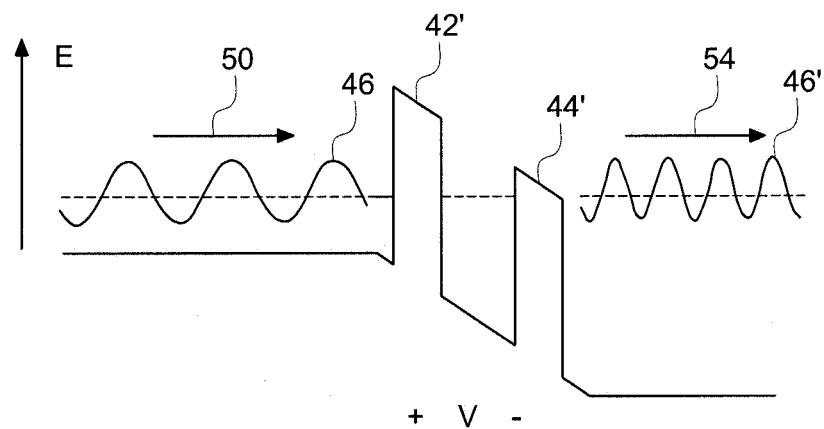

Referring now to FIGS. 2A and 2B, an energy diagram for the electron state definers is illustrated. Each of the electron state definers 14 and 16 creates a separate forbidden energy area or energy barrier. In the presently contemplated embodiment, the energy barrier 42 corresponds to the electron state definer 14, and the energy barrier 44 corresponds to the electron state definer 16. In the presence of an electric field, the energy bands of the electron state definers 14 and 16 are bent such that a resonant tunneling current passes from one electron state definer to another. The two forbidden areas 42 and 44 may or may not be identical depending on the properties of the corresponding electron state definers (such as electron state definers 14 and 16 of FIG. 1). The particle represented by the wave-like formation 46 approaches the first forbidden area 42 as represented by the arrow 50. Depending on the energy of the wave 46, the particle may or may not be able to transmit through the energy barrier 42. Even if the electron is able to transmit through the first energy barrier 42 (as represented by the dotted line 52), the probability of the particle passing through the second barrier 44 is relatively low. Hence, there is usually no tunneling current in the presence of two closely disposed energy barriers, such as barriers 42 and 44. However, in the presence of an electric field, for a given frequency (energy of electron), the electron is able to tunnel through (as illustrated by arrow 54, and wave 46') both the energy barriers 42 and 44 due to the bending of the energy barriers 42 and 44 (42' and 44', respectively), and/or a change in shape (height or width) of the one or both energy barriers 42 and 44. As a result, a resonant tunneling current is produced.

With a returning reference to FIG. 1, the electron state definers 14 and 16 may be a gap, or a heterojunction. In one embodiment, one electron state definer, such as the electron state definer 14 may be a gap, and the other electron state definer, such as the electron state definer 16 may be a heterojunction (see e.g., FIG. 3). In another embodiment, both the electron state definers 14 and 16 may be heterojunctions (see e.g., FIG. 4). Non-limiting examples of heterojunctions may include a metal-insulator, metal barrier, layers of semiconducting materials, layers of conducting materials, layers of metallic material, layers of insulating material, and layers of a fast ion conductor.

The system 10 further employs an electrode structure that includes an anode 20, a cathode 22, and a gate 24. In order to optimize operating parameters such as the resonant tunneling current, electrode materials should exhibit very low energy barrier(s) for electron emission while remaining structurally and chemically stable. Non-limiting examples of the electrode materials may include metal (e.g., gold, platinum), and materials with a low work function (such as alloys of cerium or gold).

In addition to low energy barrier(s), it is desirable to have compact electrodes (such as anode 20, cathode 22 or gate 24) to enable a smaller size of the sensor assembly. In addition to compact size, low parasitic capacitance helps maximize the bandwidth of the assembly 12. In one embodiment, the electrodes 20, 22 and/or 24 may include a capacitive design, or an antenna-like design.

The electronics generally represented by reference numeral 30 processes raw analog current from the resonant tunneling device through a signal conditioning device 26, and a controller 28. In one example embodiment, controller 28 may initially search and subsequently lock into the maximum signal strength in an analogous fashion to a phase lock loop (PLL) in communication systems. In one example embodiment, a lock-in modulator in controller 28 may have several modes to test different algorithms of varying levels of complexity. For example, controller 28 may include open loop scanning phase lock loop (PLL). By integrating controller 28 into the electronics 30, control lag may be minimized by providing at least some control in the analog signal processing space.

Controller 28 may be used to modulate a variable characteristic of at least one electron state definer. Controller 28 may modulate the variable characteristic using an actuator 32. In one example, the variable characteristic may include a gap distance. The actuator 32 may be an acoustic actuator, an electric actuator, a magnetic actuator, a capacitive actuator, a piezo-electric actuator, a thermal actuator, a shape memory alloy based actuator, or combinations thereof.

The actuator 32 receives signals/instructions from controller 28 to carry out the desired change in the variable characteristic of the electron state definers 14 and/or 16. In one example, controller 28 may modulate the variable characteristic to maintain a resonant tunneling current between the two electron state definers 14 and 16. In addition to maintaining the resonant tunneling current, in one embodiment, controller 28 may also be used for monitoring the resonant tunneling current. Optionally, controller 28 may include a comparator (not shown) to compare between the tunneling current and/or the variable characteristic. Based on a comparison between the tunneling current and/or the variable characteristic, the modulator may further modulate the variable characteristic of the electron state definers 14 and 16, and hence further optimize the tunneling current. In this embodiment, controller 28 may include or may be in operative association with a resonant tunneling current monitor 34 for monitoring the resonant tunneling current.

In certain embodiments, the resonant tunneling current monitor 34 is configured for high accuracy current sensing, and comprises ultra low noise electronics. In one embodiment, one or more functionalities of the signal conditioning device 26 may be built in to the resonant tunneling current monitor 34. For example, the resonant tunneling current monitor 34 may be configured to perform a plurality of functions, including a combination of amplification, demodulation, and analog-to-digital conversion. In one embodiment, the monitor and associated electronics may be disposed in a low noise, compact package. In one embodiment, the resonant tunneling current monitor 34 may include ultra-low noise charge sensitive integrators having high input impedance, tunable bandwidth, and low frequency noise reduction techniques. In this embodiment, the resonant tunneling current monitor 34 may also include modulators, demodulators, precision references and control circuits to actively tune the gap of the resonant tunneling In certain embodiments, an active tunneling approach may be employed when the energy barrier is tunable. The electron state definers may employ either a 2-terminal device, or a 3-terminal device, or both. Typically, 2-terminal devices such as Schottky, or metal/double-insulator/metal based tunneling diodes, are passive devices that have a fixed gap. In contrast, 3-terminal devices such as high electron mobility transistors and micro-electromechanical systems (MEMS) based devices are active devices that have the ability to dynamically control the gap. Both active and passive types of devices offer the possibility for integration with signal conditioning electronics and arraying in a multi-sensor format. Advantageously, passive devices offer relative processing simplicity. On the other hand, the active devices include noise reduction by modulation, impedance control, and substantially increased tunneling probability leading to increased sensitivity.

Figure 3:
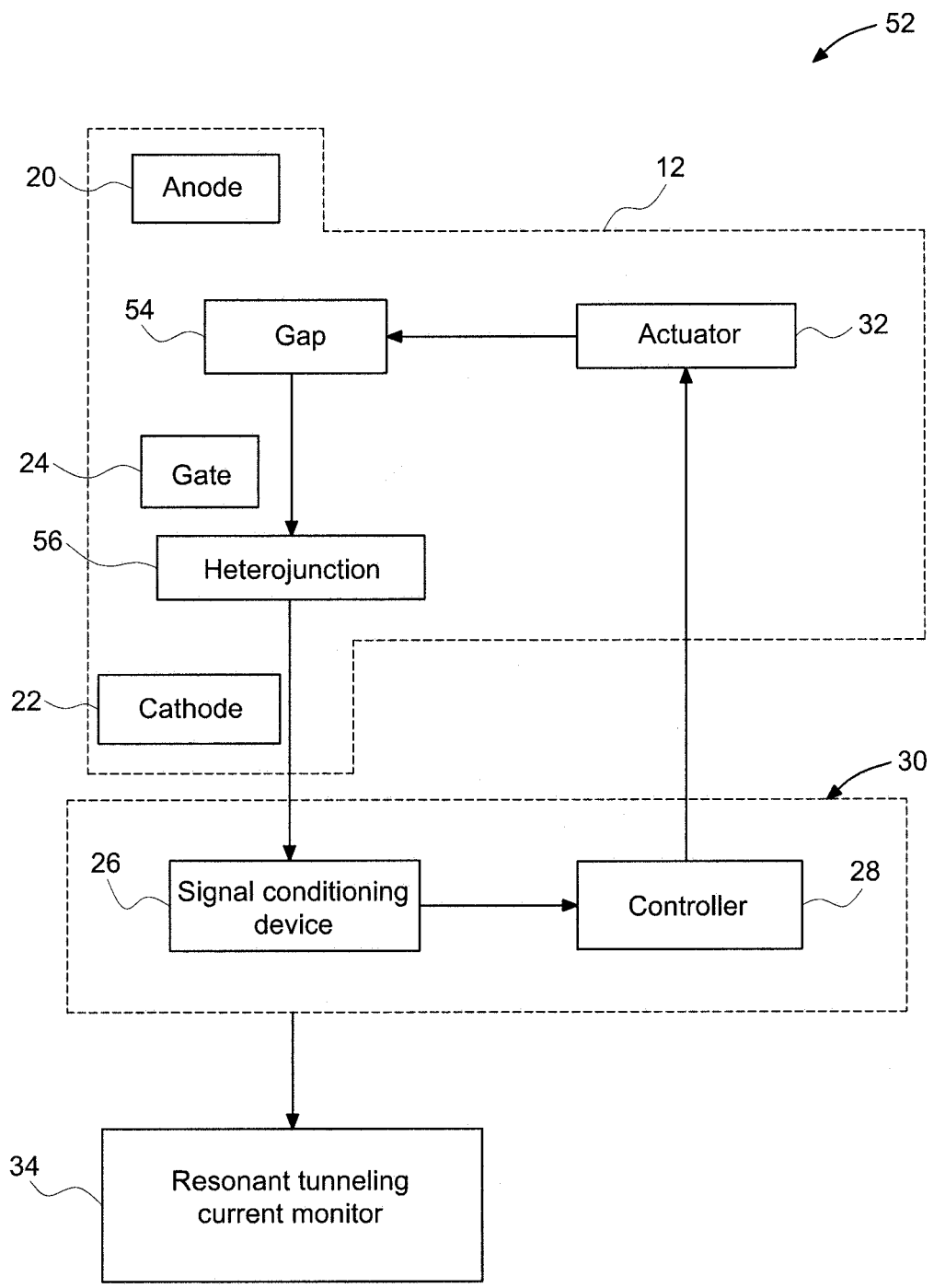
FIG. 3 is a schematic diagram representative of an example of a sensor assembly employing a gap and a heterojunction, in accordance with embodiments of the present technique.

Turning now to FIG. 3, a stand-off sensor assembly 52 includes a resonant tunneling device having a gap 64 and a heterojunction 56. The gap 64 forms an energy barrier that may be tuned to be in resonance with the energy barrier of the heterojunction 56 to allow resonance tunneling current. Non-limiting examples of the gap includes a vacuum gap, a dielectric gap, a multilayer gap, or combinations thereof. In an embodiment where the gap 64 represents a multilayer gap, the gap may include a plurality of layers that include a metallic material, an insulating material, a fast ion conductor, a semiconductor material, or combinations thereof. The plurality of layers of the multilayer gap may include an amorphous material, or a crystalline material. In one embodiment, the multilayer gap may include an emitter surface, a collector surface, or both. The multilayer gap may also include a conducting intermediate layer. In one embodiment, the gap distance may be in a range from about 5 nanometers to about 20 nanometers. In another embodiment, the gap distance may be in a range from about 3 nanometers to about 10 nanometers.

Figure 4:
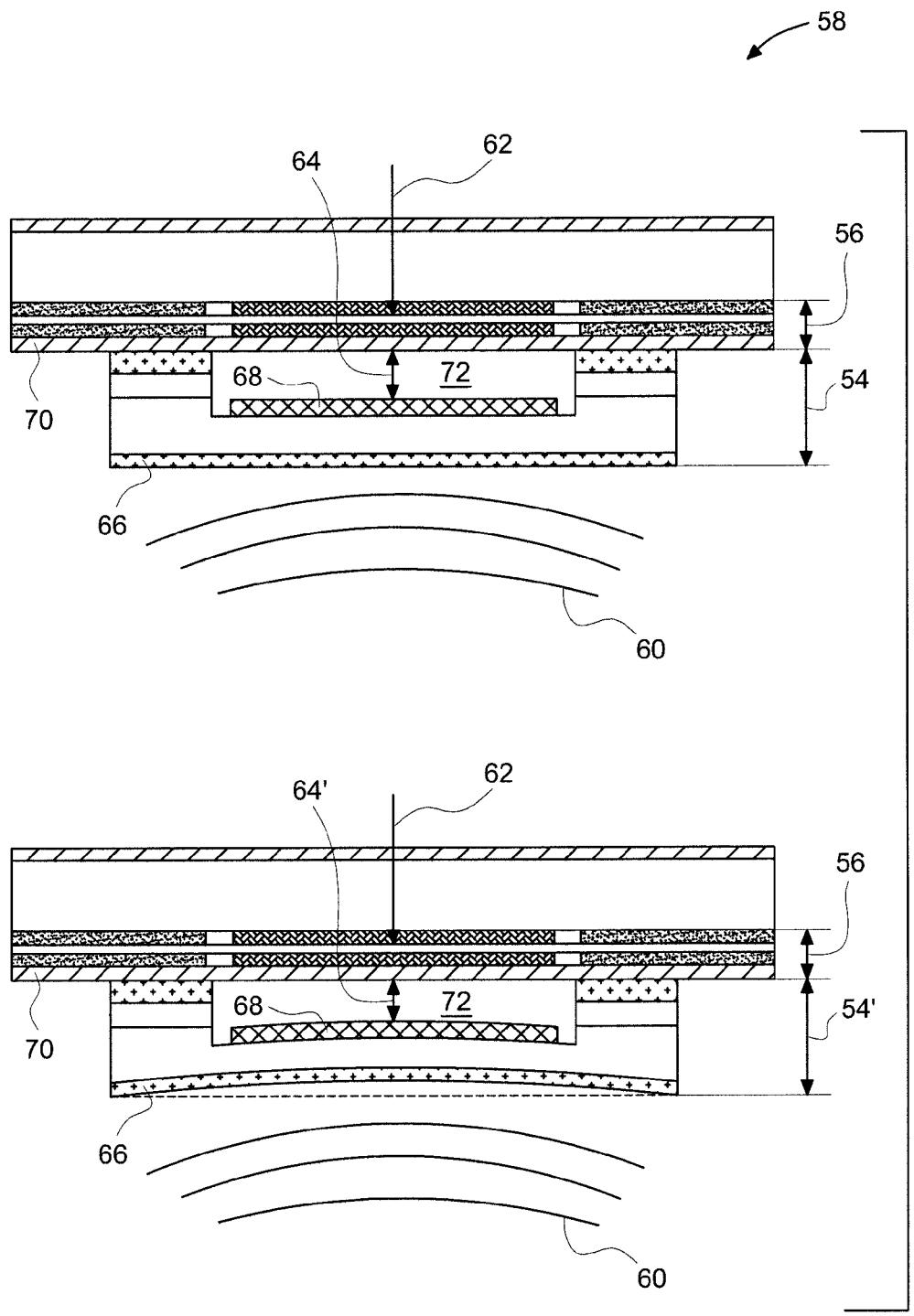
FIG. 4 is a cross-sectional view of a resonant tunneling device of the sensor assembly of FIG. 3.

As illustrated in more detail in FIG. 4, the resonant tunneling device 58 comprises the gap 64 and the heterojunction 56 as described with respect to FIG. 3. A variable characteristic of the resonant tunneling device 58 is a controllable gap distance 64 of the gap 64. In the illustrated embodiment, the gap 64 is in a series connection with the heterojunction 56. In the presence of the electric field 60, the energy bands of the gap 64 and the heterojunction 56 are bent. In addition, a modulation in the gap distance 64 modifies the energy barrier corresponding to the gap 64. The combined effect of the presence of electric field and modification of a gap distance 64 (variable characteristic) results in a resonant tunneling current passing from the gap 64 to the heterojunction 56. The resonant tunneling current 62 is a direct indicator of the electric field 60 in which the sensor assembly 52 is disposed. This resonant tunneling current 62 is dependent on the thickness or distance 64 of the gap. In contrast to conventional resonant tunneling, the gap distance may be modulated to maximize signal-to-noise ratio. For example, the resonant tunneling current may increase for a particular value of the gap distance 64. As illustrated, the gap distance 64 may be modulated/tuned by displacing at least a portion of the diaphragm 66. In the illustrated embodiment, the gap 64 is defined by two layers 68 and 70. In certain embodiments, the layer 68 may include an evaporated metal layer, and the layer 70 may include a highly doped silicon layer that is electrically conductive. The insulator used in between these two layers is a vacuum 72. In the presently contemplated embodiment, the displacement of the diaphragm 66 causes a shift in the layer 68 with respect to layer 70, thereby causing a change in the gap distance 64. A change in the gap distance 64 results a shift in the energy barrier to enable a flow of resonant tunneling current in the heterojunction 56 and the gap 64.

Advantageously, in some embodiments, the resonant tunneling device is configured to operate at frequencies above 1 GHz analogous to resonant tunneling diodes which are conventionally the preferred designs for high frequency operation of semiconductor devices.

In one embodiment, the gap may be a central barrier in the resonant tunneling device formed of a gap and a heterojunction. In another embodiment, the gap may be a top or a bottom barrier. As will be appreciated, the electron wave function decays in the barriers and modulation of the gap barrier width on the extreme ends of the device may not change the electron wave function enough to change the eigenvalues of the quasi-bound states. Accordingly, in the case of the structure having the gap in the middle of the resonant tunneling device, the tuning of the quasi-bound-state energies may be more sensitive to the gap size as compared to the case when the gap is either the first or third barrier, resulting in enhanced tunability and ease of fabrication.

Figure 5:
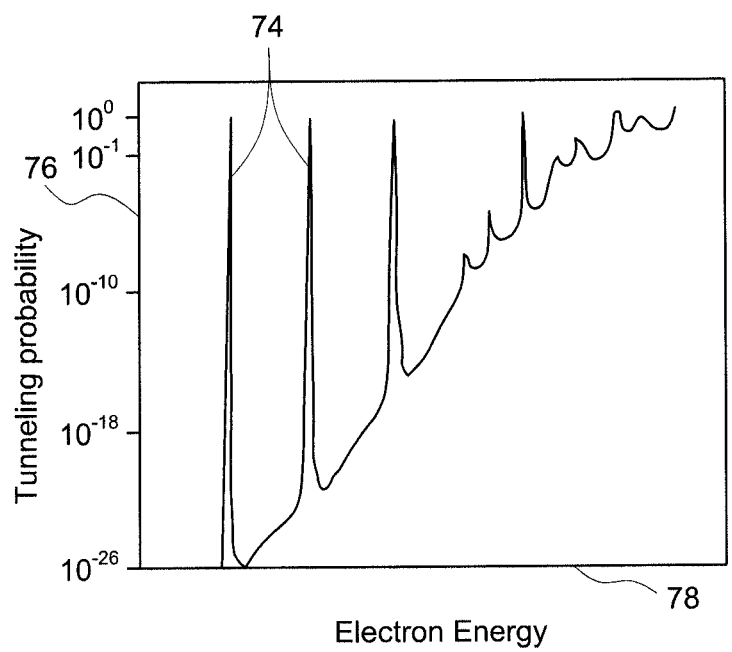
FIG. 5 is a graphical representation of resonant tunneling for a band gap structure of the resonant tunneling device of FIG. 3.

A resonant tunneling emitter quantum-mechanically coupled to a gap significantly increases the current level as compared to a Fowler-Nordheim field emitter as illustrated in FIG. 5. In addition, an almost mono-energetic distribution of the emitted electrons produces well-resolved oscillations of the tunneling current as a function of an electric field to be sensed, and a value of a variable characteristic, such as a gap thickness. Effectively, the intermediate states in the energy band enhance transport when the energy of the system is resonant with that of the intermediate states. In addition, the position of tunneling peaks depends on the variable characteristic, such as a gap thickness. Consequently, tuning of the peaks (74) is achieved by varying the gate potential (bias). The width of tunneling probability (ordinate 76) increases for higher electron energy (abscissa 78) and smaller work function and, conversely, decreases with increasing the bandgap thickness, material thickness (for examples, of heterojunctions layers), or a gap distance.

In the illustrated embodiment, the gap distance is actively controlled to tune the resonant tunneling to move the operation of the device to one of the peaks. In addition to the ability to modulate noise, the tunable gap obviates the need to address impedance matching. The advantages of a passive device include using electronic modulation to mitigate the effects of low frequency (1/f) noise. This has the effect of moving the baseband away from the 1/f noise regime by synchronous demodulation of the output after amplification.

Advantageously, in the arrangement of the sensor assembly of the present technique, the variable characteristic can be varied mechanically to modulate the signal away from low frequency (1/f) noise, thereby maximizing signal strength of tunneling, while increasing the detector's sweet spot and making it largely immune to processing variation, temperature changes, and other drift parameters. As illustrated in FIG.

6, resonant tunneling results in substantial increase in the signal 80 detected with respect to noise 82 and spurious signal 84. The signal 80 can be partially isolated from noise 82 and spurious signal 84. In one embodiment, modulation of a variable characteristic of the resonant tunneling device moves the signal (such as the signal 80) out of band to higher frequency (signal 86) away from the noise as illustrated arrow 88. This signal shift results in noise levels in the detector system that are comparable to less than $10\,e/Hz^{1/2}$. Noise improvement by modulation of a variable characteristic of a resonant tunneling device enables single electron charge resolution at room temperature. Resonant tunneling is also an advantageous approach from a frequency range perspective since resonant tunneling devices are commonly used in multi-GHz circuitry and known to have RC time constants on the order of a picosecond.

Figure 7:
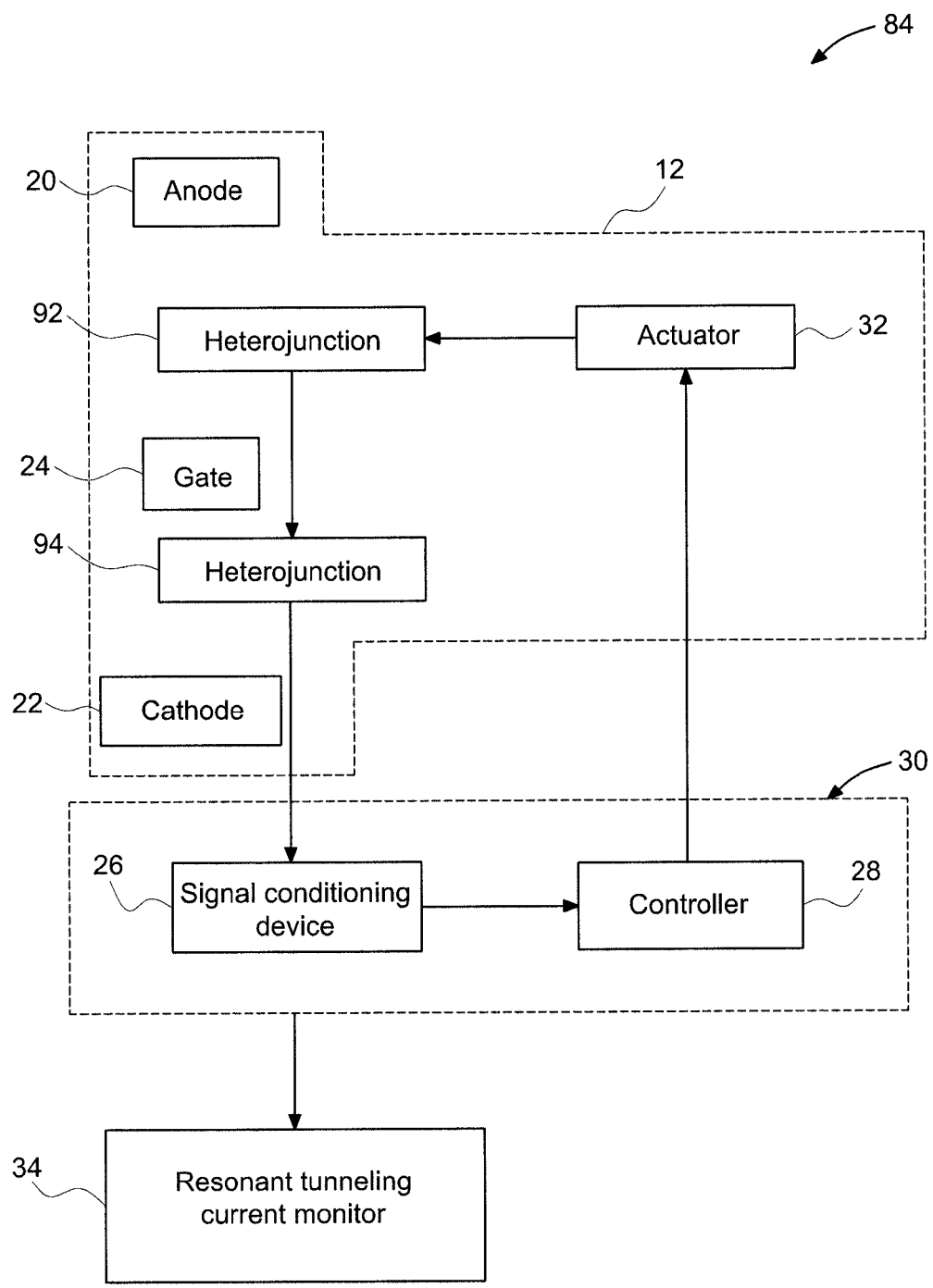
FIG. 7 is a schematic diagram representative of an example of a sensor assembly employing two heterojunctions, in accordance with embodiments of the present technique.
Figure 8:
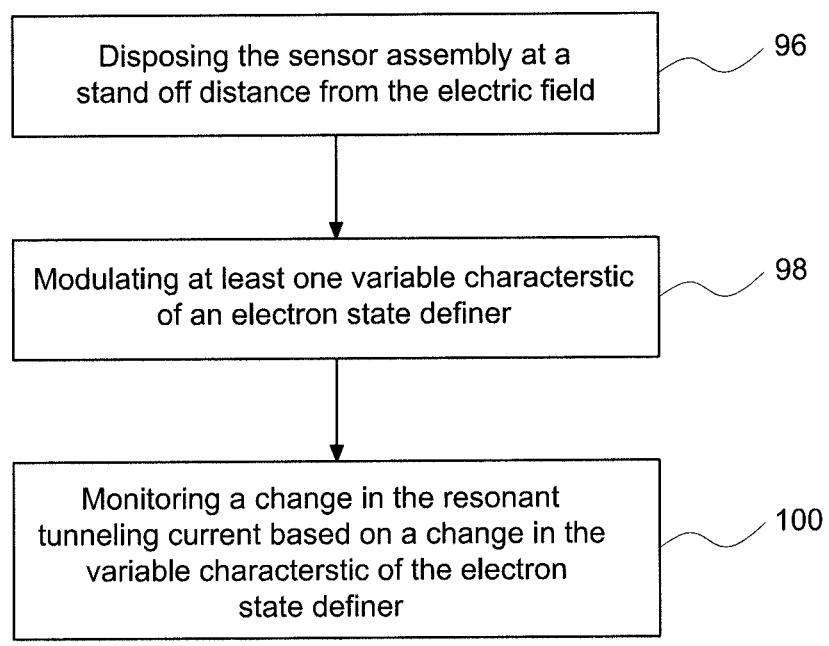
FIG. 8 is a flow chart for example steps that may be involved in a method for detecting an electric field using a sensor assembly, in accordance with embodiments of the present technique.

As illustrated in FIG. 7, the potential profiles required for resonant tunneling in the sensor assembly 90 may be realized in semiconductor systems of the hetero-junctions, such as hetero-junctions 92 and 94. The hetero-junctions 92 and 94 may utilize semiconductors of different types to create potential barriers or wells in the conduction band or the valence band. The layers comprising the hetero-junctions 92 and 94 may include low work function materials. The layers of the low work function materials form a quantum well for resonant tunneling. In one embodiment, the work functions of the layers of the heterojunctions may be in a range from about 0.75 eV to about 0.85 eV. Reducing the work function of the emitting material leads to an increase in field emission current density leading to more efficient tunneling device. Even a small reduction in the work functions may lead to a large increase in tunneling current density because the tunneling probability scales with the inverse exponential of the electrode work function.

In one embodiment, a method of selectively tuning the energy band in a quantum well heterostructure includes implanting ions into the heterostructure to form a disordered region, or varying thickness of one or more layers of the heterostructure. The vacancies and defects created by the implantation may be spatially separated from the quantum well active region. The heterostructure may be thermally annealed so that the vacancies diffuse through the active region (quantum wells) and enhance interdiffusion at the heterojunctions, thereby modifying the optical bandgap of the quantum well layers. The bandgap tuning is selective because the implantation step can be appropriately controlled. In another embodiment, the bandgap may be modulated by disposing piezoelectric material between the layers of the heterojunctions. The piezoelectric material may be used to vary the thickness of the layers of the heterojunctions.

In certain embodiments, a method for using the sensor assembly is provided. A method for sensing a parameter representative of an electrical field from a stand-off distance is provided. The method includes generating tunneling current in response to the electric field. The tunneling current may be generated and modulated using at least two electron state definers. The method includes disposing the sensor assembly at a stand-off distance from the source of the electric field and still induce a voltage between the electron state definers (block 96).

At block 98, a variable characteristic of at least one of the electron state definer is modulated. The tunneling current is modulated by varying at least one variable characteristic of the electron state definers. In one example where the electron state definer is a resonant tunneling device having a gap, the variable characteristic may include the gap distance, which can be modulated using acoustic actuation, a magnetic actuation, an electric actuation, a capacitive actuation, a piezoelectric actuation, a thermal actuation, or an actuation using shape memory alloy. In another embodiment, the variable characteristic may include a bias voltage applied to, for example, to a gate electrode.

In one embodiment, the tunneling current is modulated by actuating at least one of a first element and a second element of a gap. The step of actuating at least one of the first element and the second element may include monitoring a resistance characteristic corresponding to a spacing between the first element and the second element, and moving at least the first element and the second element until a determined resistance characteristic is achieved. The determined resistance characteristic may include a linear resistance characteristic indicative of ohmic conduction.

In one embodiment, the gap distance may be actively tuned using control feedback circuitry from the electronics to the drive potential on the sensor assembly. Alternatively, the gap may be modulated such that the frequency shifts the output of the sensor assembly to the modulating frequency. By synchronously demodulating and filtering of the amplified electronic signal, the low frequency noise may be reduced to desired levels. For electric fields at higher frequencies, in addition to very low thermal noise charge amplifiers, tunable band-pass filters may be used to band-limit the noise.

At block 100, a change in the resonant tunneling current is monitored while varying at least one variable characteristic of one of the electron state definers. In certain embodiments, the current flowing between the electron state definers is monitored and recorded over a period of time while varying the variable characteristic. Therefore, the monitoring provides a range of values representing the fluctuation of the current flowing between the electron state definers. These values may then be employed to arrive at the value of the existing electric field.

When resonant tunneling occurs in the presence of the electrical field, at specific values of the variable characteristic, a tunneling current flows between the electron state definers. The magnitude of the tunneling current depends on the electric field, the variable characteristic, and on the internal electronic band structure of the sensor assembly. The resulting resonant tunneling spectrum provides information on the value of the electric field.

Optionally, the method includes a step of transmitting data or results from the monitoring step (block 100) to a remote location. By "remote location" is meant a location other than the location at which the detection occurs.

Further signal extraction may be achieved with a high-speed digitizer and subsequent digital signal processing. Calibration techniques to track and compensate for gain and offset drift with temperature and time may be incorporated into the sensor assembly/ASIC system. The compensation may be a combination of analog tracking and digital coefficient correction.

The stand-off electric field sensor of the present technique is adapted to sense electric fields over large frequency ranges while being compact and power efficient. The stand-off electric field sensor may be employed in a detector array to perform a high-sensitivity, low noise measurement of high bandwidth electric fields. Ultra low noise electronics combined with the stand-off sensor allows for the realization of physically dense detector arrays that have a high spatial resolution of electric field. Unlike traditional optic approaches using the electro-optic effect, the detector array having the stand-off electric field sensor provides a more compact device, that has extremely low wall power, and lower cost which could enable applications for individual soldiers. It is anticipated that advanced development efforts for sensitive, small form-factor, and low cost electric field sensors would result in a new approach that will enable longer-term continuous monitoring of electric fields. The advantages of using resonant tunneling include very high bandwidth, low noise capability, small, size and packaging, and high spatial resolution. These properties lead to further benefits such as arraying capability and wafer-level packaging.

Aspects of the description below build upon the theoretical underpinnings, and the structural and/or operational interrelationships described in the preceding disclosure for sensing an electric field (E-field), such as may be applied in accordance with aspects of the present invention to a sensor assembly made up of an array of Micro-Electro-Mechanical System (MEMS)-based resonant tunneling devices, which when combined with low-noise electronics may be used to perform a high-sensitivity, low-noise, non-contact measurement of the E-field, including E-fields having different characteristics. Example applications that may benefit from aspects of the present invention may include sensing and instrumentation systems, communication systems, biomedical systems, radar and surveillance systems, etc.

It will be appreciated that MEMS generally refer to micron-scale structures that for example can integrate a multiplicity of functionally distinct elements, e.g., mechanical elements, electromechanical elements, sensors, actuators, and electronics, on a common substrate through micro-fabrication technology. It is contemplated, however, that many techniques and structures presently available in MEMS devices may become available via nanotechnology-based devices, e.g., structures that may be smaller than 100 nanometers in size. Accordingly, even though example embodiments described throughout this document may refer to an array of Micro-Electro-Mechanical System (MEMS)-based resonant tunneling devices, it is submitted that the inventive aspects of the present invention should be broadly construed and should not be limited to micron-sized devices.

Figure 9:
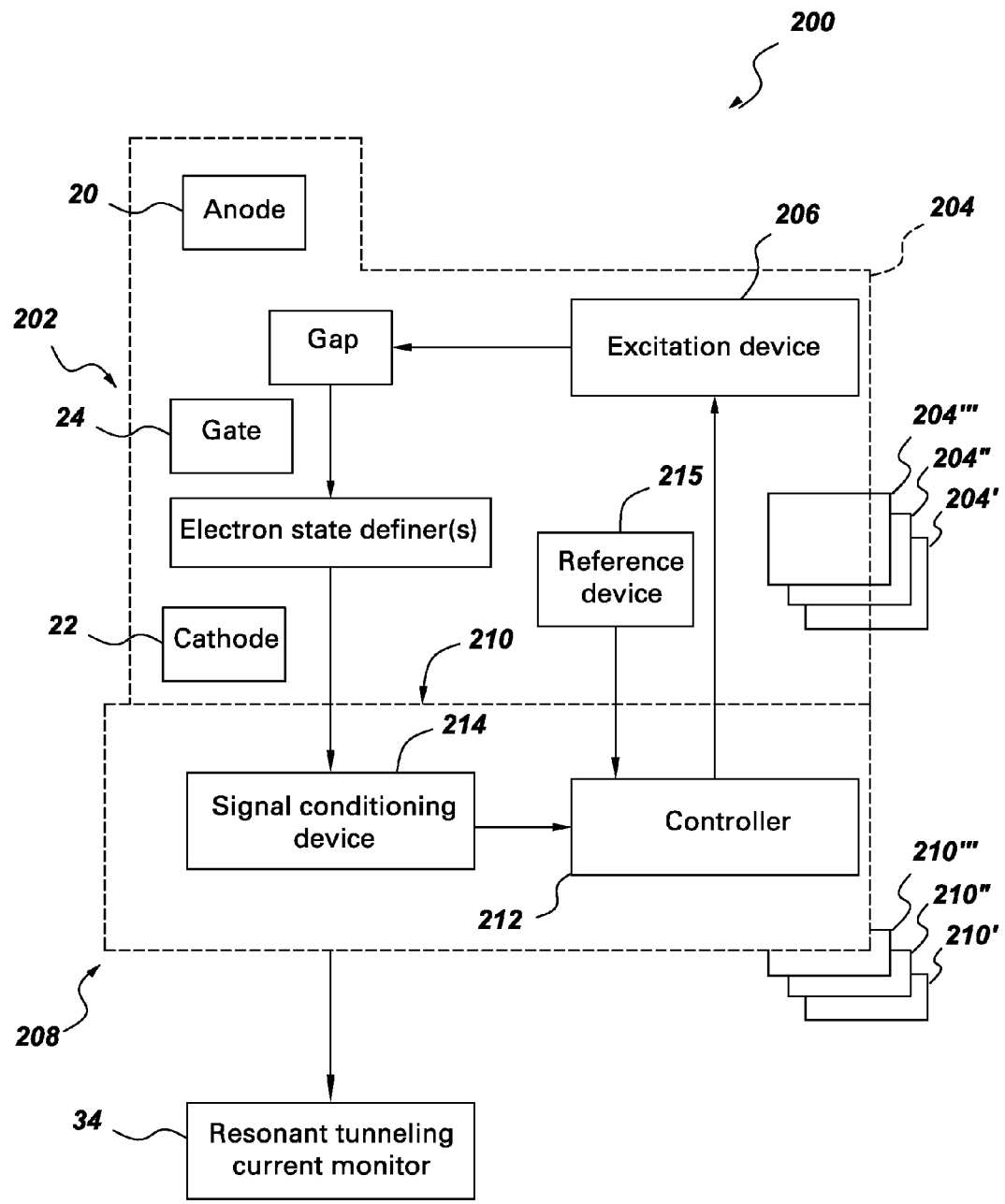
FIG. 9 is a block diagram representation of an example array of Micro-Electro-Mechanical System (MEMS)-based resonant tunneling devices and corresponding electronics embodying aspects of the present invention.

FIG. 9 illustrates an example system 200 as may be used for non-contactively measuring an electric field generated by an object. A sensor assembly 202 may be made up of an array 204-204''' of Micro-Electro-Mechanical System (MEMS)-based resonant tunneling devices embodying aspects of the present invention. For the sake of avoiding cluttering detail, resonant tunneling devices 204'-204''' are illustrated in FIG. 9 in a graphically abbreviated representation.

The abbreviated graphical representation shown in FIG. 9 should not be construed as an indication of a geometrical arrangement for the resonant tunneling devices. For example, FIG. 9 should not be construed as an indication of a stacked arrangement into the plane of the paper of the figure for resonant tunneling devices 204-204''' since such resonant tunneling devices in one example embodiment may constitute a two-dimensional array, as may be disposed on the plane of the paper of the figure. Based on the preceding description, it will be appreciated that each tunneling device may be configured to generate a respective resonant tunneling signal in response to the electric field. An excitation device 206 may be configured to effect changes to a controllable characteristic (e.g., gap spacing, heterojunction interface thickness, bias voltage, or combination of the foregoing) affecting the tunneling signal. The excitation device may be based on any of various modalities, such as an electrostatic excitation device, a magnetic excitation device, a thermal excitation device, an acoustic excitation device, a piezo-electric excitation device, a shape memory alloy based excitation device.

In practice, the goal is to measure relatively small electric fields, which will precisely bend the energy bands of the resonant tunneling structure. Accordingly, consideration should be given not to create extraneous electric fields which would introduce error to the E-field measurements. Moreover, the gap and/or heterojunction should be modulated with high resolution. Thus, practical embodiments of the excitation device may be based on generation of acoustic waves, as may be implemented in MEMS-based devices, such as piezoelectric or capacitive micro-machined ultrasound transducers (cMUTs) that may be integrated on the same substrate as the resonant tunneling device.

As further illustrated in FIG. 9, an electronics assembly 208 may be made up of an array of electronics assemblies 210-210'''. For example, each electronics assembly may include a controller 212, which may be coupled to excitation device 206 to control the changes of the controllable characteristic. A signal conditioning device 214 may be configured to provide a desired signal conditioning to the tunneling signal. Once again, for the sake of avoiding cluttering detail, electronic assemblies 210'-210''' are illustrated in FIG. 9 in a graphically abbreviated representation.

In one example embodiment, signal conditioning device 214 and/or additional electronic components of a given electronics assembly may be electrically closely coupled to resonant tunneling device 204 in an integrated circuit (IC) package. This package may be configured to reduce parasitic capacitances and/or inductances and allow for a compact IC structure. In one example embodiment, a high-density interconnect (HDI) process may be used to embed a semiconductor die within the package such that contact with opposite surfaces (e.g., top and bottom sides) of the die can be made. For example, the electronics assembly, as may correspond to a given resonant tunneling device disposed on the topside of the package, may be located on the underside of the package, and be electrically coupled to one another using interconnecting vias between the topside and the underside of the package. Another example integration technique may be a process where the MEMS device and electronics (e.g., CMOS electronics) may be disposed or manufactured on the same wafer, and hence these parts are disposed on the same die at the end of the fabrication steps.

In one example embodiment, at least some of the array of resonant tunneling devices may be configured to share in common one or more components, such as the excitation device, signal conditioning device and the controller. For example, excitation device 206 of sensor assembly 204 may be coupled to excite the respective tunneling gaps in sensor assemblies 204' and 204'', in addition to the tunneling gap of sensor assembly 204. In another example scenario, controller 212 of electronics assembly 210 may be coupled to control the respective excitation devices of sensor assemblies 204' and 204'', in addition to excitation device 206 of sensor assembly 204. In yet another example scenario, signal conditioning device 214 of electronics assembly 210 may be coupled to condition the respective resonant tunneling signals of sensor assemblies 204' and 204'', in addition to resonant tunneling signal of sensor assembly 204. For example, if the electric field comprises a generally non-varying characteristic, such as a generally non-varying frequency, then the example array of resonant tunneling devices described above may be controlled, excited and/or conditioned by the shared controller, excitation device and/or signal conditioning device consistent with the generally non-varying characteristic of the electric field. That is, in such an example, each of the resonant tunneling devices may be controllably tuned consistent with the frequency of the electric field being measured. This could be exploited to map a spatial distribution of such an electric field.

In another example embodiment, each resonant tunneling device in at least some of the array of resonant tunneling devices may comprise a respective excitation device, signal conditioning device and/or controller. That is, one or more of such respective devices is dedicated just to one resonant tunneling device. For example, in contrast to the foregoing shared example arrangement, excitation device 206 of sensor assembly 204 may be coupled just to excite the tunneling gap of sensor assembly 204, or excitation device 206 of sensor assembly 204' may be coupled just to the tunneling gap of sensor assembly 204' and so on and so forth. In another example scenario, controller 212 of electronics assembly 210 may just be coupled to excitation device 206 of sensor assembly 204, or controller 212 of electronics assembly 210' may be coupled just to excitation device 206 of sensor assembly 210' and so on and so forth. In yet another example scenario, signal conditioning device 214 of electronics assembly 210 may just be coupled to condition just the resonant tunneling signal of sensor assembly 204, or signal conditioning device 214 of electronics assembly 210' may be coupled to condition just the resonant tunneling signal of sensor assembly 210' and so on and so forth For example, if one electric field and a further electric field generated in the object have at least one different characteristic, such as having different E-field frequencies, then at least some of the elements of the example array of resonant tunneling devices described above may be individually controlled, conditioned and/or excited by the respective controller, conditioning device and/or excitation device consistent with the different characteristic of the electric fields. This example arrangement may be useful to map a spatial distribution of electric fields having different characteristics. Aspects of the present invention contemplate an architecture involving (MEMS)-based resonant tunneling devices and corresponding electronics that may be dynamically configured to seamlessly morph based on the needs of a given application, such as from an architecture optimized for detection of a low-frequency E-field to an architecture optimized for detection of high-frequency E-field or both.

Figure 10:
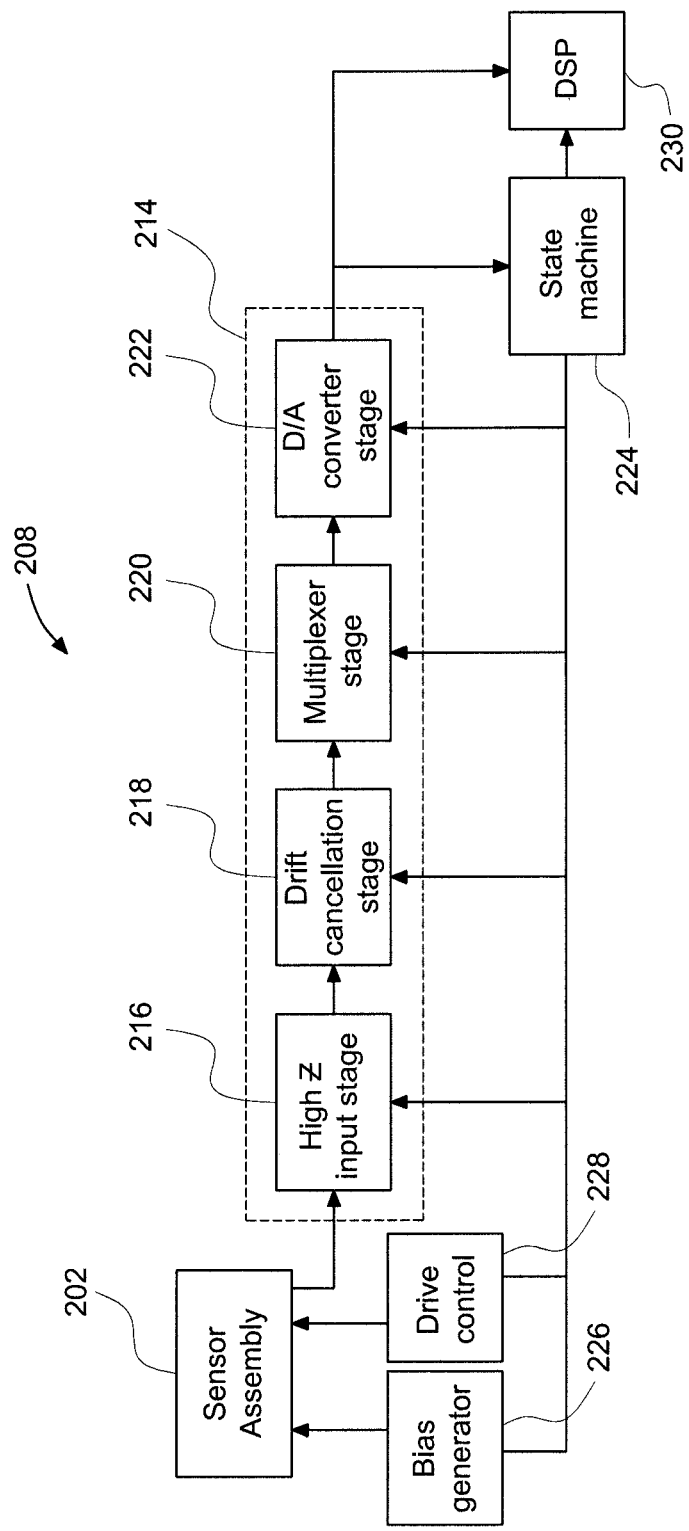
FIG. 10 is a block diagram representation of an electronics assembly as may be used with a resonant tunneling sensor embodying aspects of the present invention.

FIG. 10 is a block diagram schematic of example circuitry that may be used in electronics assembly 208 coupled to resonant tunneling sensor assembly 202. In one example embodiment, signal conditioning device 214 may include a high-impedance input stage 216 for receiving the tunneling signal from the sensor assembly, such as may include metal-oxide-semiconductor field effect transistors (MOSFETs) circuitry. Because of the relatively low-level of electrical currents that may be involved (e.g., in the order of a few nanoamperes), a drift cancellation stage 218 may be used to provide suitable cancellation or reduction to circuit parameter drifts (e.g., DC drift, gain drift, etc.) that may arise over time and/or as the result of temperature variation, for example. In one example embodiment, signal conditioning device 214 may be configured as a multi-channel signal conditioning device and may include a multiplexer stage 220 coupled to an analog-to-digital converter stage 222 in turn coupled to supply a digitized tunneling signal to a controller, which in one example embodiment may comprise a logic state machine 224. State machine 224 may be configured to execute a control strategy configured to reduce the effect of noise on a measurement of the electric field. For example, state machine 224 may be configured to execute a number of states consistent with the control strategy (e.g., correlated double sampling) configured to reduce the effect of noise, such as low-frequency noise, on the measurement of the electric field. For example, during a first example state the controllable characteristic (e.g., gap spacing) of the electron state definers may be selected to suppress a response of the tunneling device to the electric field to obtain a measurement of noise. During a second example state, the controllable characteristic of the electron state definers may be selected to elicit the response of the tunneling device to the electric field to obtain a measurement of the tunneling signal plus noise. During a third state, a subtraction of the measurement obtained in the second state from the measurement obtained in the first state is performed to obtain a measurement of the tunneling signal, which is substantially free of noise. In one example embodiment, at least some of the circuitry in electronics assembly 208 may be synchronously controlled by controller 212 to achieve the control strategy configured to reduce the effect of noise (e.g., low-frequency noise) on the measurement of the electric field. For example, multiplexer stage 220 may be controlled by the controller to synchronously multiplex respective measurements based on the states of the state machine.

In one example embodiment, controller 212 may be coupled to a reference device 215 configured to reduce a noise effect due to one or more physical variable on a measurement of the electric field. In one example embodiment, reference device 215 may be a device, which is substantially insensitive to electric fields but capable of sensing other non-E-field variables, such as temperature, vibration, pressure, etc., which could affect the E-field measurement accuracy of the resonant tunneling device. In one example embodiment, controller 212 may be configured to differentially compensate for such non-electrically driven noise effects. For example, if a measurement of an electric field from the resonant tunneling device comprises a first component due to the electric field being measured plus a second component due to the non-electrical noise effects, then a difference of the output signal from the tunneling device from the output signal from the reference device would be able to obtain a measurement of the electric field which is essentially free from inaccuracies, which otherwise may be introduced due to any such non-E-field variables.

FIG. 10 further illustrates a bias generator device 226 configured to generate a bias signal, such as a bias voltage applied to an electrode (e.g., gate) of the tunneling device. For example, tuning of resonant tunneling peaks 74 (FIG. 5) may in part be achieved by varying the bias voltage applied to the electrode. A drive control 228 may be configured to generate a suitable signal for driving excitation device 206 (FIG. 10) to modulate the variable characteristic (e.g., gap spacing, heterojunction interface thickness).

A digital signal processor (DSP) 230 may be configured to process digitized data as may be used to construct an image depicting structural features (e.g., bundles of neurons) that may be, involved in the production of the E-field.

It will be appreciated that DSP 230 in combination with state machine 224 may be configured to make use of information that may be gained from one or more neighboring tunneling devices and/or corresponding electronics. For example, real-time or near real-time knowledge of a respective resonant tunneling response of one or more neighboring tunneling devices of a given tunneling device may be helpful to determine the specific gap modulation characteristics to be used for the given tunneling device. Similarly, real-time or near real-time knowledge of a respective signal-to-noise ratio present in one or more neighboring tunneling devices may be helpful to determine specific signal conditioning characteristics to be used for the given tunneling device. It will be appreciated that the use of shared information from neighboring tunneling devices is conducive to perform a high-sensitivity, low-noise, non-contact measurement of the E-field. For example, one skilled in the art would appreciate that the magnitude of an electrical signal, as may be used to drive gap modulation, if not appropriately accounted for, could be a source of error in the measurement of the E-field. However, a coordinated approach, which in accordance with aspects of the present invention dynamically shares information acquired from one or more neighboring components, is helpful to compensate for potential sources of error.

Figure 6:
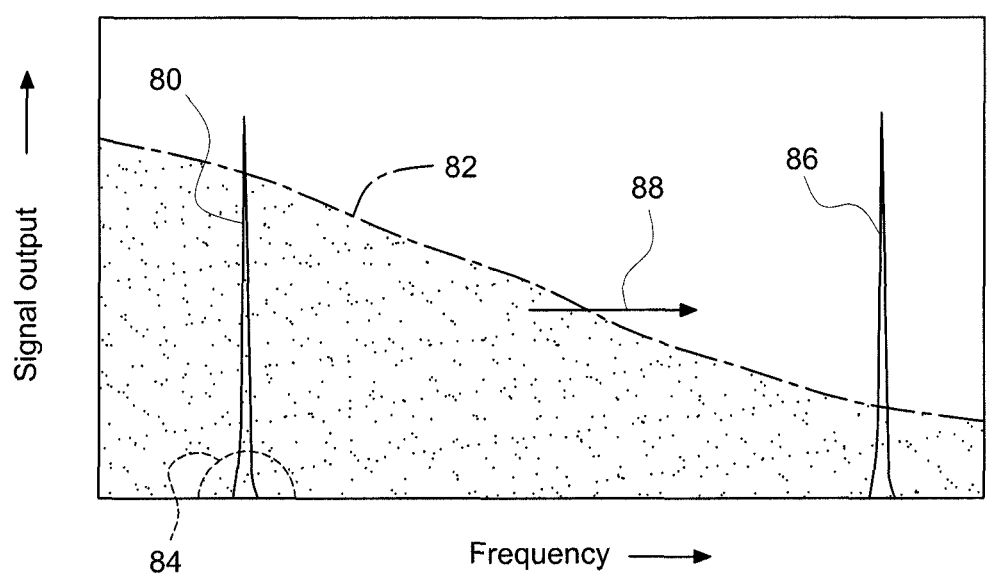
FIG. 6 is a diagrammatic representation of a shift in the signal due to modulation of the variable characteristic of the resonant tunneling device.

As may be appreciated for the signal shift illustrated in FIG. 6, the controllable characteristic of the gap may be modulated by the excitation device to cause a frequency shift in a response of the tunneling device to the electric field from a first frequency region subject to a first signal-to-noise ratio (e.g., signal 80 and corresponding noise level 82 for signal 80) to a second frequency region subject to a second signal-to-noise ratio (e.g., signal 86 and corresponding noise level 82 for signal 86), where a value of the second signal-to-noise ratio is higher than a value of the second signal-to-noise ratio.

Figure 11:
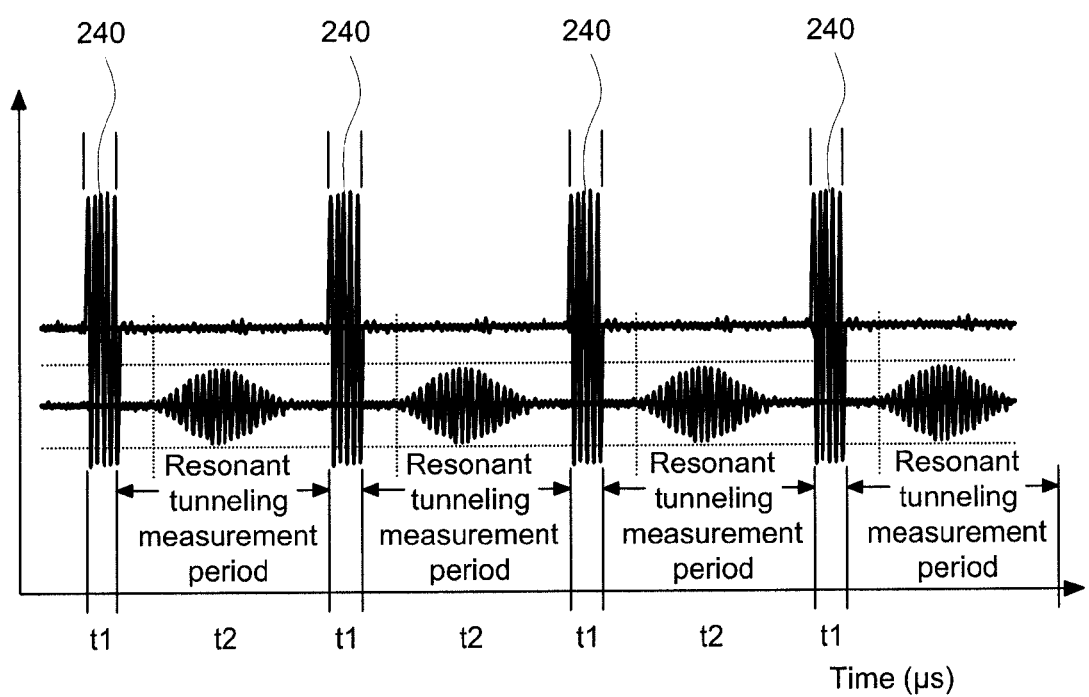
FIG. 11 shows an example excitation technique, as may be used to obtain a low-noise resonant tunneling measurement of an electric field.

As illustrated in FIG. 11, an example excitation device, such as acoustic-based excitation device, may be actuated in response to a sequence of pulses 240 arranged to provide a respective on-state for the excitation device during a first time interval (e.g., interval t1) to cause the frequency shift to the second frequency region, as discussed above. The sequence of pulses is further arranged to provide a respective off-state for the excitation device during a second time interval (e.g., interval t2) sufficiently close to the first time interval to obtain a measurement of the response of the tunneling device to the electric field while 1) the response of the tunneling device to the electric field remains in the second frequency region, and 2) the excitation device is in the off-state. (e.g., interval t2). For example, the excitation device would be turned on during interval t1 and the resonant tunneling effect would be measured during interval t2. It will be appreciated that the foregoing is another example of a technique configured to avoid or reduce potential electrical interference that could result during excitation of the modulated gap.

In operation, example capabilities of a system embodying aspects of the present invention may be appreciated from a consideration of practical aspects involved just in sensing the electric field due to few or a single neuron. Presuming an example axon comprises a 5 mm long×1 μm diameter cylinder, and the static potential V of a single neuron to be V~100 mV, the electric field at a distance r~1 cm from the effective dipole would be approximately 100 μV/m. Action potentials have a typical pulse of swing from −70 mV to +40 mV, in about 2-5 ms. Further presuming a bandwidth from DC to ~1 kHz is needed for single neuron events, it is estimated that in this example application, a sensitivity in the order of a few $\mu V/m/Hz^{1/2}$ would be provided, such as approximately 3 $\mu V/m/Hz^{1/2}$. Similarly, if we assume a brain volume~700 cm$^3$ with ~$10^{11}$ neurons yielding an average neuron "volume" of ~7000 mm$^3$ and an average axon spacing is about 20 μm, it is estimated that in this example application, a spatial resolution in the order of a tens of μm would be provided to resolve 20 μm features from a distance of ~1 cm away. It will be appreciated that the foregoing should be construed in an example sense and not in a limiting sense being that aspects of the present invention are not limited to any particular application and/or numerical values.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A system for non-contactively measuring an electric field generated in an object, the system comprising:
    a sensor assembly comprising a resonant tunneling device configured to generate a resonant tunneling signal in response to the electric field, wherein the resonant tunneling device comprises at least one electron state definer responsive to changes in at least one respective controllable characteristic of the electron state definer, the changes in said at least one controllable characteristic configured to affect the tunneling signal;
    an excitation device coupled to the resonant tunneling device to effect at least one of the changes in said at least one controllable characteristic affecting the tunneling signal; and
    a controller coupled to the resonant tunneling device and the excitation device to control the changes of said at least one controllable characteristic in accordance with an automated control strategy configured to reduce an effect of noise on a measurement of the electric field.

2. The system of claim 1, wherein the controller comprises a state machine configured to execute a number of states consistent with the control strategy configured to reduce the effect of noise on a measurement of the electric field.

3. The system of claim 1, further comprising a reference device configured to sense at least one non-electric field variable affecting the measurement of the electric field, the controller coupled to the reference device to reduce a noise effect from said at least one non-electric field variable on the measurement of the electric field.

4. The system of claim 1, wherein the sensor assembly comprises a Micro-Electro-Mechanical systems (MEMS)-based resonant tunneling device, wherein said at least one electron state definer comprises a gap, wherein the controllable characteristic of the gap comprises a gap spacing between elements of the tunneling device that define the gap, and further wherein the excitation device is configured to effect a change of the gap spacing affecting the tunneling signal.

5. The system of claim 1, wherein said at least one electron state definer further comprises a bias signal, wherein the controllable characteristic of the bias signal comprises a bias voltage applied to an electrode of the tunneling device.

6. The system of claim 5, wherein a bias generator responsive to the controller is configured to effect a change of the bias signal affecting the tunneling signal.

7. The system of claim 5, wherein said at least one electron state definer further comprises a heterojunction interface, wherein the controllable characteristic of the heterojunction interface comprises a thickness of the heterojunction interface.

8. The system of claim 1, wherein said at least one electron state definer is selected from the group consisting of a gap between elements of the tunneling device, a heterojunction interface in the tunneling device, a bias signal applied to an electrode of the tunneling device, and a combination of said electron state definers.

9. The system of claim 2, wherein the state machine comprises a first state wherein said at least one controllable characteristic of the electron state definer is selected to suppress a response of the tunneling device to the electric field to obtain a measurement of noise.

10. The system of claim 9, wherein the state machine comprises a second state wherein said at least one controllable characteristic of the electron state definer is selected to elicit the response of the tunneling device to the electric field to obtain a measurement of the tunneling signal plus noise.

11. The system of claim 10, wherein the state machine comprises a third state comprising a subtraction of the measurement obtained in the second state from the measurement obtained in the first state to obtain a measurement of the tunneling signal, which is substantially free of noise.

12. The system of claim 4, wherein the controllable characteristic of the gap is modulated by the excitation device to cause a frequency shift in a response of the tunneling device to the electric field from a first frequency region subject to a first signal-to-noise ratio to a second frequency region subject to a second signal-to-noise ratio, wherein a value of the second signal-to-noise ratio is higher than a value of the second signal-to-noise ratio.

13. The system of claim 12, wherein the excitation device is actuated in response to a sequence of pulses arranged to provide a respective on-state for the excitation device during a first time interval to cause the frequency shift to the second frequency region, the sequence of pulses further arranged to provide a respective off-state for the excitation device during a second time interval sufficiently close to the first time interval to obtain a measurement of the response of the tunneling device to the electric field while 1) the response of the tunneling device to the electric field remains in said second frequency region, and 2) the excitation device is in the off-state.

14. The system of claim 1, wherein the sensor assembly comprises an array of Micro-Electro-Mechanical system (MEMS)-based resonant tunneling devices.

15. The system of claim 14, wherein at least some of the array of resonant tunneling devices share in common at least one of the following devices: the excitation device, the controller, and a signal conditioning device.

16. The system of claim 14, wherein each resonant tunneling device in at least some of the array of resonant tunneling devices has at least one individually dedicated device from the following devices: the excitation device, the controller and a signal conditioning device.

17. The system of claim 2 further comprising a signal conditioning device coupled to the resonant tunneling device to provide signal conditioning to the tunneling signal, wherein the signal condition device comprises a high impedance input stage for receiving the tunneling signal from the tunneling device.

18. The system of claim 17, wherein the signal conditioning device further comprises at least one analog-to-digital converter coupled to supply a digitized tunneling signal to the state machine.

19. The system of claim 14, wherein the controller comprises a state machine configured to execute a number of states consistent with the control strategy configured to reduce the effect of noise on a measurement of the electric field, the system further comprising a multi-channel signal conditioning device including a multiplexer configured to multiplex a plurality of signals conditioned by the multi-channel signal conditioning device, wherein the multiplexer is controlled by the controller to synchronously multiplex respective measurements based on the states of the state machine.

20. The system of claim 17, wherein the signal conditioning device is electrically closely coupled to the resonant tunneling device in an integrated circuit package.

21. The system of claim 1, wherein the excitation device is selected from the group consisting of an electrostatic excitation device, a magnetic excitation device, a thermal excitation device, an acoustic excitation device, a piezo-electric excitation device, a shape memory alloy based excitation device, or a combination thereof.

22. The system of claim 14, wherein the controller is configured to execute the control strategy to reduce the effect of noise on a measurement of the electric field in a respective tunneling device of the array of resonant tunneling devices based on information acquired from at least a neighboring resonant tunneling device of the array of resonant tunneling devices.

23. The system of claim 1, wherein the excitation device comprises a Micro-Electro-Mechanical systems (MEMS)-based excitation device, wherein said controllable characteristic is effected by the (MEMS)-based excitation device by way of an actuation selected from the group consisting of an electrostatic actuation, a magnetic actuation, a thermal actuation, an acoustic actuation, a piezo-electric actuation, a shape memory alloy based actuation, or a combination thereof.

24. A system for non-contactively measuring an electric field generated in an object, the system comprising:
a sensor assembly comprising an array of Micro-Electro-Mechanical System (MEMS)-based resonant tunneling devices, each tunneling device configured to generate a respective resonant tunneling signal in response to the electric field and comprising at least one electron state definer responsive to changes in at least one respective controllable characteristic of the electron state definer, the changes in said at least one controllable characteristic configured to affect the tunneling signal;
an excitation device configured to effect at least one of the changes in said at least one controllable characteristic affecting the tunneling signal;
a controller configured to control the changes of said at least one controllable characteristic; and
a signal conditioning device configured to provide signal conditioning to the tunneling signal,
wherein at least some of the array of resonant tunneling devices share in common at least one of the following devices: the excitation device, the controller, and the signal conditioning device,
wherein the electric field comprises at least one generally non-varying characteristic, wherein said at least some of the array of resonant tunneling devices is sharingly controlled, excited and/or conditioned by the corresponding shared device consistent with said at least one generally non-varying characteristic of the electric field, wherein said at least some of the array of resonant tunneling devices are configured to map a spatial distribution of the electric field.

25. A system for non-contactively measuring at least one electric field generated in an object, the system comprising:
a sensor assembly comprising an array of Micro-Electro-Mechanical System (MEMS)-based resonant tunneling devices, each tunneling device configured to generate a respective resonant tunneling signal in response to said at least one electric field and comprising at least one electron state definer responsive to changes in at least one respective controllable characteristic of the electron state definer, the changes in said at least one controllable characteristic configured to affect the tunneling signal;
an excitation device configured to effect at least one of the changes in said at least one controllable characteristic affecting the tunneling signal;
a controller configured to control the changes of said at least one controllable characteristic; and
a signal conditioning device configured to provide signal conditioning to the resonant tunneling signal,
wherein each resonant tunneling device in at least some of the array of resonant tunneling devices has at least one individually dedicated device from the following devices: the excitation device, the controller and the signal conditioning device, wherein said at least one electric field and at least a further electric field generated in the object have at least one different characteristic, wherein one or more of said at least some of the array of resonant tunneling devices is controlled, excited and/or conditioned by the corresponding dedicated device consistent with said at least one different characteristic of the electric fields, wherein said at least some of the array of resonant tunneling devices are configured to map a spatial distribution of said at least one electric field and said further electric field having said at least one different characteristic.

* * * * *